United States Patent
Kim et al.

(10) Patent No.: US 10,811,568 B2
(45) Date of Patent: Oct. 20, 2020

(54) SEMICONDUCTOR LIGHT EMITTING DEVICE AND SEMICONDUCTOR LIGHT EMITTING DEVICE PACKAGE USING THE SAME

(71) Applicant: Samsung Electronics Co., Ltd., Suwon-si, Gyeonggi-do (KR)

(72) Inventors: Tae Hun Kim, Bucheon-si (KR); Jae In Sim, Yongin-si (KR); Ju Heon Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/181,592

(22) Filed: Nov. 6, 2018

(65) Prior Publication Data

US 2019/0348571 A1    Nov. 14, 2019

(30) Foreign Application Priority Data

May 11, 2018    (KR) .......................... 10-2018-0054120

(51) Int. Cl.
```
H01L 33/40    (2010.01)
H01L 33/62    (2010.01)
H01L 33/52    (2010.01)
H01L 33/10    (2010.01)
```
(52) U.S. Cl.
CPC ............ *H01L 33/405* (2013.01); *H01L 33/10* (2013.01); *H01L 33/52* (2013.01); *H01L 33/62* (2013.01)

(58) Field of Classification Search
CPC ....... H01L 33/405; H01L 33/46; H01L 33/10; H01L 33/60
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

KR     10-1752425 B1     6/2017

*Primary Examiner* — Grant S Withers
(74) *Attorney, Agent, or Firm* — Sughrue Mion, PLLC

(57) ABSTRACT

A semiconductor light emitting device includes a first conductivity-type semiconductor layer including a recessed region and a protruding region, an active layer and a second conductivity-type semiconductor layer on the protruding region, a reflective electrode layer disposed on the second conductivity-type semiconductor layer, an insulating layer including a first opening disposed on a contact region of the first conductivity-type semiconductor layer and a second opening disposed on a contact region of the reflective electrode layer, a first conductive pattern disposed on the insulating layer, and extending into the first opening to be electrically connected to the contact region of the first conductivity-type semiconductor layer, a second conductive pattern disposed on the insulating layer, and extending into the second opening to be electrically connected to the reflective electrode layer, and a multilayer insulating structure covering the first and second conductive patterns.

8 Claims, 20 Drawing Sheets

(56) References Cited

U.S. PATENT DOCUMENTS

| | | | |
|---|---|---|---|
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,357,949 B2 | 1/2013 | Kim et al. | |
| 8,368,114 B2 | 2/2013 | Yang | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,559,265 B2 | 1/2017 | Chyu et al. | |
| 9,793,448 B2 | 10/2017 | Jung et al. | |
| 2010/0051995 A1* | 3/2010 | Katsuno | H01L 24/05 257/98 |
| 2011/0266570 A1* | 11/2011 | Hsieh | H01L 33/486 257/98 |
| 2012/0074441 A1* | 3/2012 | Seo | H01L 27/153 257/91 |
| 2014/0353708 A1* | 12/2014 | Seo | H01L 27/153 257/98 |
| 2015/0349232 A1* | 12/2015 | Lee | H01L 27/0248 257/91 |
| 2016/0149086 A1* | 5/2016 | Sim | H01L 33/46 257/98 |
| 2016/0225955 A1* | 8/2016 | Chen | H01L 33/486 |
| 2016/0240746 A1 | 8/2016 | Yun et al. | |
| 2016/0254414 A1* | 9/2016 | Jung | H01L 33/42 257/98 |
| 2016/0365486 A1* | 12/2016 | Kim | H01L 33/382 |
| 2017/0236979 A1 | 8/2017 | Seo et al. | |
| 2017/0279020 A1* | 9/2017 | Kim | H01L 33/62 |
| 2017/0288088 A1* | 10/2017 | Won Cheol | H01L 33/58 |
| 2018/0190871 A1* | 7/2018 | Kim | H01L 33/36 |
| 2019/0341536 A1* | 11/2019 | Choi | H01L 33/48 |

\* cited by examiner

SEMICONDUCTOR LIGHT EMITTING DEVICE AND SEMICONDUCTOR LIGHT EMITTING DEVICE PACKAGE USING THE SAME

CROSS-REFERENCE TO RELATED APPLICATION

This application claims benefit of Korean Patent Application No. 10-2018-0054120 filed on May 11, 2018, with in the Korean Intellectual Property Office, the disclosure of which is incorporated herein-by reference in its entirety.

FIELD

The present inventive concept relates to a semiconductor light emitting device and a semiconductor light emitting device package using the same.

BACKGROUND

Light emitting diodes are devices in which substances included in devices emit light through the application of electrical energy thereto, and energy generated by the recombination of electrons and holes of a bonded semiconductor is converted into light and emitted. Such light emitting diodes are being widely used as lighting devices, display devices, and light sources, and the development thereof is accelerating.

In detail, the development of general lighting devices using light emitting diodes has been actively undertaken due to the commercialization of mobile phone keypads, turn signal lamps, camera flashes and the like, using gallium nitride (GaN)-based light emitting diodes having recently been developed and used. As in applications thereof, such as backlight units for large-sized TVs, automobile headlights, general lighting devices, and the like, the use of light emitting diodes has been progressively increasing as the size, output, and efficiency of products.

Such light emitting diodes have a problem in which as a portion of light emitted by an active layer is reflected by the surface of a package body in which a light emitting diode is mounted, and is incident on the light emitting diode, external light extraction efficiency is reduced.

SUMMARY

An aspect of the present inventive concept is to provide a semiconductor light emitting device and a semiconductor light emitting device package having improved external light extraction efficiency.

According to an aspect of the present inventive concept, a semiconductor light emitting device includes a first conductivity-type semiconductor layer including a recessed region and a protruding region, an active layer and a second conductivity-type semiconductor layer sequentially stacked on the protruding region of the first conductivity-type semiconductor layer, a reflective electrode layer disposed on the second conductivity-type semiconductor layer, an insulating layer covering the first conductivity-type semiconductor layer and the reflective electrode layer, wherein the insulating layer comprises a first opening disposed on a contact region of the first conductivity-type semiconductor layer and a second opening disposed on a contact region of the reflective electrode layer, a first conductive pattern disposed on the insulating layer, wherein the first conductive pattern extends into the first opening of the insulating layer to be electrically connected to the contact region of the first conductivity-type semiconductor layer, a second conductive pattern disposed on the insulating layer, wherein the second conductive pattern extends into the second opening of the insulating layer to be electrically connected to the reflective electrode layer, and a multilayer insulating structure covering the first and second conductive patterns, wherein the multilayer insulating layer includes third and fourth openings disposed on the first and second conductive patterns.

According to an aspect of the present inventive concept, a semiconductor light emitting device includes a light emitting structure including a first conductivity-type semiconductor layer, an active layer and a second conductivity-type semiconductor layer sequentially stacked on a substrate, and having a region from which the second conductivity-type semiconductor layer and the active layer are partially removed, a reflective electrode layer disposed on the second conductivity-type semiconductor layer, an insulating layer covering the first conductivity-type semiconductor layer and the reflective electrode layer, wherein the insulating layer includes a first opening disposed on a contact region of the first conductivity-type semiconductor layer, and a second opening disposed on a contact region of the reflective electrode layer, a first conductive pattern disposed on the insulating layer, wherein the first conductive pattern extends into the first opening of the insulating layer to be electrically connected to the contact region of the first conductivity-type semiconductor layer, a second conductive pattern disposed on the insulating layer, wherein the second conductive pattern extends into the second opening of the insulating layer to be electrically connected to the reflective electrode layer, and a multilayer insulating structure covering the first and second conductive patterns, wherein the multilayer insulating structure includes third and fourth openings disposed on the first and second conductive patterns.

According to an aspect of the present inventive concept, a semiconductor light emitting device package includes a package body including a trench in which a first multilayer insulating structure is disposed on an internal surface of the trench, a semiconductor light emitting device electrically connected by flip chip bonding in the trench, and an encapsulation portion filling an interior of the trench to cover the semiconductor light emitting device, wherein the semiconductor light emitting device includes: a first conductivity-type semiconductor layer including a recessed region and a protruding region; an active layer and a second conductivity-type semiconductor layer sequentially stacked on the protruding region of the first conductivity-type semiconductor layer; a reflective electrode layer disposed on the second conductivity-type semiconductor layer; an insulating layer covering the first conductivity-type semiconductor layer and the reflective electrode layer, wherein the insulating layer comprises a first opening disposed on a contact region of the first conductivity-type semiconductor layer and a second opening disposed on a contact region of the reflective electrode layer; a first conductive pattern disposed on the insulating layer, wherein the first conductive pattern extends into the first opening of the insulating layer to be electrically connected to the contact region of the first conductivity-type semiconductor layer; a second conductive pattern disposed on the insulating layer, wherein the second conductive pattern extends into the second opening of the insulating layer to be electrically connected to the reflective electrode layer; and a second multilayer insulating structure covering the first and second conductive patterns, wherein the second multilayer insulating structure comprises third and fourth openings disposed on the first and second conductive patterns, wherein the first and second multilayer insulating structures include a distributed Bragg reflector in which a first layer having a first refractive index and a second layer having a second refractive index higher than the first refractive index are alternately stacked.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
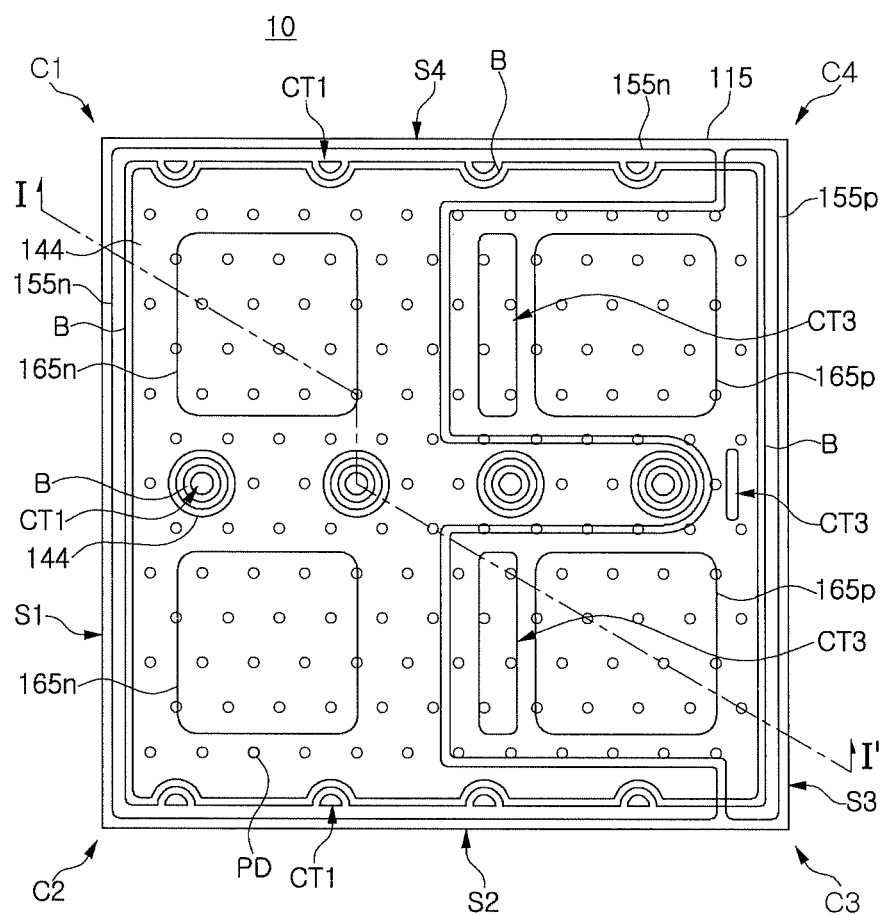
FIG. 1 is a schematic plan view of a semiconductor light emitting device according to an example embodiment of the present inventive concept.
Figure 2:
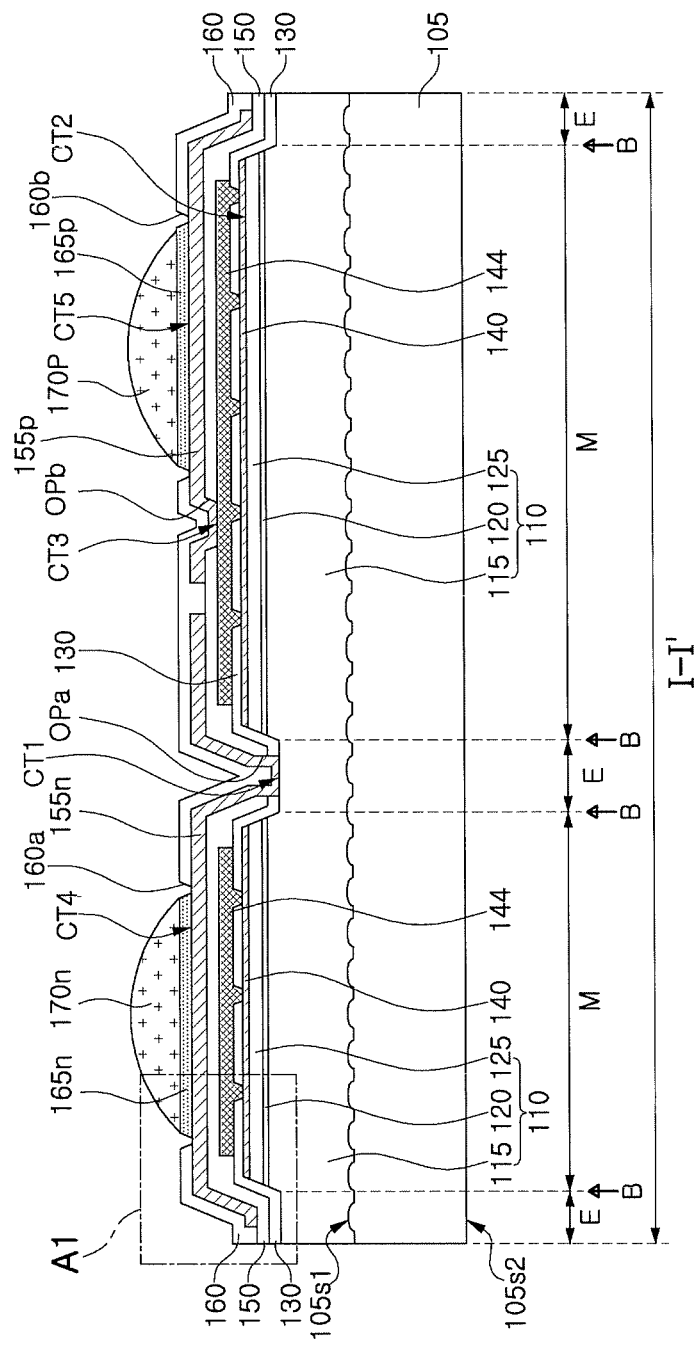
FIG. 2 is a cross-sectional view of the semiconductor light emitting device, taken along line I-I' of FIG. 1.
Figure 3:
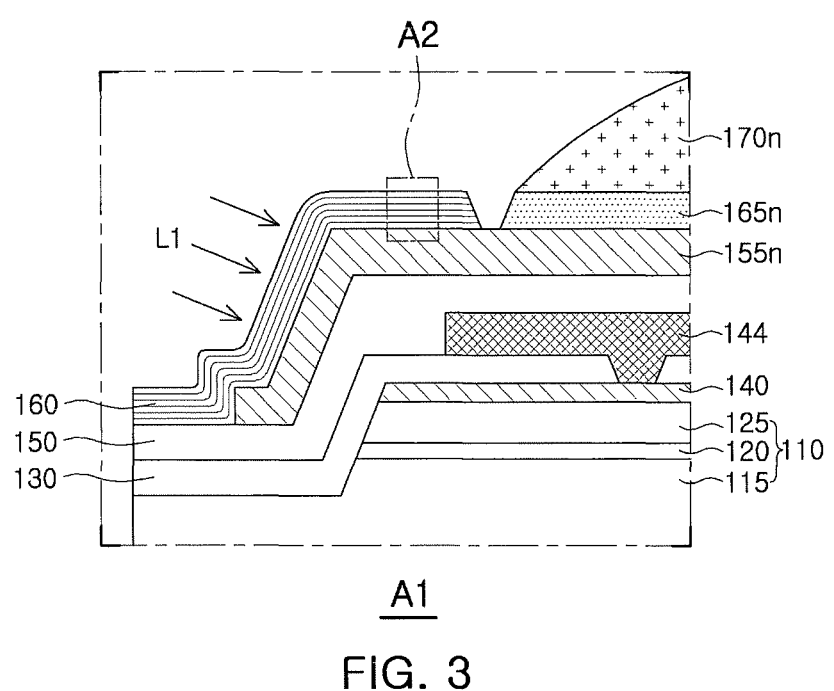
FIG. 3 is an enlarged view of portion A1 of FIG. 2.
Figure 4:
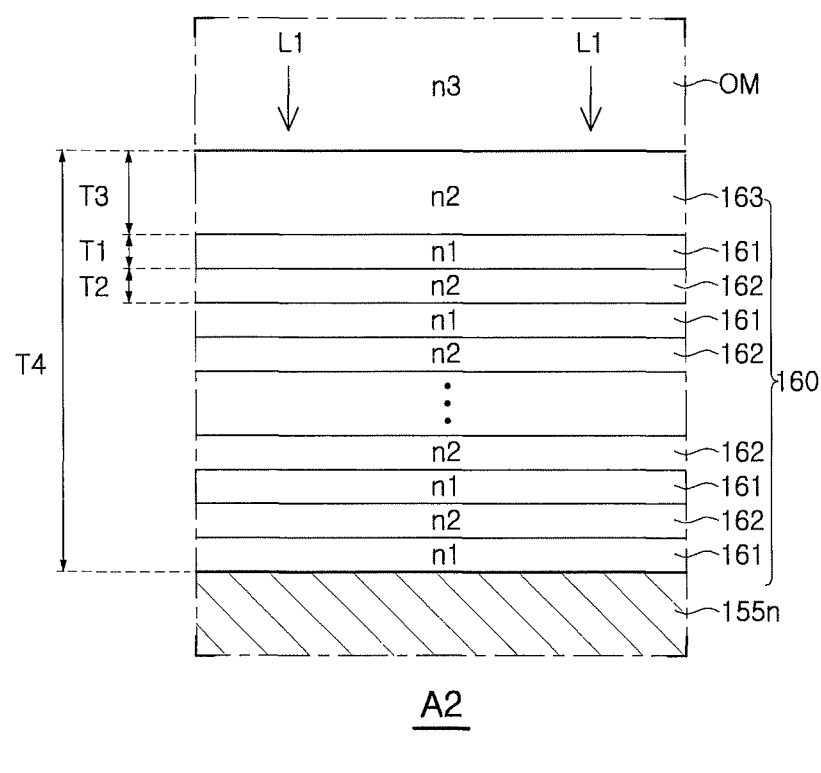
FIG. 4 is an enlarged view of portion A2 of FIG. 3.

A semiconductor light emitting device 10 according to an example embodiment will be described with reference to FIGS. 1 to 4. FIG. 1 is a schematic plan view of a semiconductor light emitting device according to an example embodiment, and FIG. 2 is a cross-sectional side view of the semiconductor light emitting device, taken along line I-I' of FIG. 1. FIG. 3 is an enlarged view of portion A1 of FIG. 2, and FIG. 4 is an enlarged view of portion A2 of FIG. 3.

The semiconductor light emitting device 10 according to an example embodiment may include a substrate 105, a light emitting structure 110, a reflective electrode layer 144, an insulating layer 130, first and second conductive patterns 155n and 155p, and a multilayer structure 160.

The substrate 105 may have a front surface 105s1 and a rear surface 105s2 facing the front surface 105s1. The substrate 105 may be a substrate for semiconductor growth, and may be formed of an insulating, conductive or semiconducting material, such as sapphire, silicon (Si), SiC, $MgAl_2O_4$, MgO, $LiAlO_2$, $LiGaO_2$, GaN or the like. The sapphire may be a crystal having hexagonal-rhombo (Hexa-Rhombo R3c) symmetry while having electrical insulating characteristics, and may be used as a substrate for growth of a nitride semiconductor.

Throughout the specification, terms such as 'front surface', 'rear surface' and the like, are used to distinguish relative positions in components, and example embodiments of the present inventive concept are not limited by these terms. The terms, 'front surface', 'rear surface' and the like, may be used to describe components in example embodiments of the present inventive concept, by being replaced with other teams, for example, 'first surface', 'second surface' and the like or with terms such as 'upper surface', 'lower surface' and the like. Thus, the front surface 105s1 and the rear surface 105s2 of the substrate 105 may be replaced by an upper surface 105s1 and a lower surface 105s2 of the substrate 105, or may be replaced by the first surface 105s1 and the second surface 105s2.

The light emitting structure 110 may be disposed on the front surface 105s1 of the substrate 105.

In an example, the front surface 105s1 of the substrate 105 may be formed to have a concavo-convex structure, and the concavo-convex structure may improve crystalline characteristics and external light extraction efficiency of semiconductor layers constituting the light-emitting structure 110. In the example embodiment, the concavo-convex structure of the front surface 105s1 of the substrate 105 is illustrated as having a dome-shaped convex shape, but an example embodiment thereof is not limited thereto. For example, the concavo-convex structure of the front surface 105s1 of the substrate 105 may be formed to have various forms such as a quadrangular shape, a triangular shape or the like. In addition, the concavo-convex structure of the front surface 105s1 of the substrate 105 may be selectively formed, or may also be omitted.

In an example, the substrate 105 may be removed later, depending on an example embodiment. For example, after the substrate 105 is provided as a growth substrate for growth of the light emitting structure 110, the substrate 105 may be removed through a separation process. The separation of the substrate 105 may be performed to be separated from the light emitting structure 110 by a method such as a laser lift off (LLO), a chemical lift off (CLO), or the like.

The light emitting structure 110 may include a first conductivity-type semiconductor layer 115, an active layer 120, and a second conductivity-type semiconductor layer 125.

The first conductivity-type semiconductor layer 115 may be formed by growing from the front surface 105s1 of the substrate 105. The first conductivity-type semiconductor layer 115 may be formed of a semiconductor doped with an n-type impurity, and may be an n-type nitride semiconductor layer.

When viewed from above, the first conductivity-type semiconductor layer 115 may have a quadrangular shape. The first conductivity-type semiconductor layer 115 may have a first corner C1, a second corner C2, a third corner C3 and a fourth corner C4, sequentially arranged in a counter-clockwise direction, when viewed from above. When viewed from above, the first conductivity-type semiconductor layer 115 may have a first edge S1 between the first corner C1 and the second corner C2, a second edge S2 between the second corner C2 and the third corner C3, a third edge S3 between the third corner C3 and the fourth corner C4, and a fourth edge S4 between the fourth corner C4 and the first corner C1. Thus, the first and third edges S1 and S3 may face each other, and the second and fourth edges S2 and S4 may face each other.

The first conductivity-type semiconductor layer 115 may be self-aligned on the substrate 105 when viewed from above, such that the first to fourth corners C1 to C4 and the first to fourth edges S1 to S4 of the first conductivity-type semiconductor layer 115 may also be equally applied to the substrate 105.

The first conductivity-type semiconductor layer 115 may include a recessed region E and a protruding region M. The recessed region E may be referred to as an etched region, and the protruding region M may be referred to as a mesa region.

In the drawings, the reference character 'B' may indicate a boundary B between the recessed region E and the protruding region M. In the first conductivity-type semiconductor layer 115, an upper surface of the protruding region M may be higher than an upper surface of the recessed region E.

In an example, the protruding region M may have a shape gradually narrowed from the bottom to the top. Thus, the protruding region M may have an inclined side surface.

In an example, a portion of the upper surface of the recessed region E may be defined as a first contact region CT1. In an example, at least a portion of the upper surface of the protruding region M may be defined as a second contact region CT2.

Throughout the specification, terms such as 'first', 'second', and the like, may be used to describe various components, but the components are not limited by the terms. The terms are used only to distinguish one component from other components. For example, a 'first component' may be referred to as a 'second component' without departing from the scope of the preset inventive concept.

In the first conductivity-type semiconductor layer 115, the protruding region M may be spaced apart from the first to fourth edges S1 to S4, and the recessed region E may be disposed between the protruding region M and the first to fourth edges S1 to S4.

When viewed from above, the recessed region E may extend in a direction from a portion of the first edge S1 to the third edge S3.

The active layer 120 and the second conductivity-type semiconductor layer 125 may be sequentially stacked on the upper surface of the protruding region M of the first conductivity-type semiconductor layer 115. The second conductivity-type semiconductor layer 125 may be formed of a semiconductor doped with a p-type impurity, and may be a p-type nitride semiconductor layer.

In an example, stacking positions of the first and second conductivity-type semiconductor layers 115 and 125 may be reversed according to an example embodiment. The first and second conductivity-type semiconductor layers 115 and 125 may be represented by empirical formula $Al_xIn_yGa_{(1-x-y)}N$ ($0 \leq x < 1$, $0 \leq y < 1$, $0 \leq x+y < 1$), corresponding to a material such as GaN, AlGaN, InGaN, AlInGaN or the like.

The active layer 120 may be interposed between the first and second conductivity-type semiconductor layers 115 and 125. The active layer 120 may emit light having a predetermined level of energy by the recombination of electrons and holes when the semiconductor light emitting device 10 operates. The active layer 120 may include a material having an energy band gap narrower than an energy band gap of the first and second conductivity-type semiconductor layers 115 and 125. For example, when the first and second conductivity-type semiconductor layers 115 and 125 are GaN compound semiconductors, the active layer 120 may include an InGaN compound semiconductor having an energy band gap narrower than an energy band gap of GaN. In addition, the active layer 120 may have a multiple quantum well (MQW) structure in which a quantum well layer and a quantum barrier layer are alternately stacked, and for example, may have an InGaN/GaN structure, but an example embodiment thereof is not limited thereto. The active layer 120 may have a single quantum well (SQW) structure.

A transparent electrode layer 140 may be disposed on an upper surface of the second conductivity-type semiconductor layer 125. The transparent electrode layer 140 may be formed of a conductive and light transmissive material to diffuse a current injected from the reflective electrode layer 144 to prevent current from being concentrated in a portion of the second conductivity-type semiconductor layer 125. Although the transparent electrode layer 140 may be disposed to cover the entirety of the second conductivity-type semiconductor layer 125, the transparent electrode layer 140 may also be disposed to only cover a portion of the second conductivity-type semiconductor layer 125 according to an example embodiment. The transparent electrode layer 140 may be formed of a transparent conductive oxide (TCO) material, such as indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or $Zn_{(1-x)}Mg_xO$ (Zinc Magnesium Oxide, $0 \leq x \leq 1$), and may also be formed of a light transmissive polymer resin having conductivity by including at least one of silver (Ag) nanowire and carbon nanotube (CNT).

The insulating layer 130 may be disposed on the transparent electrode layer 140. The insulating layer 130 may be disposed to cover the transparent electrode layer 140, and a through-hole PD may be formed. The insulating layer 130 may cover a portion of the first conductivity-type semiconductor layer 115 and a portion of the second conductivity-type semiconductor layer 125. The insulating layer 130 may include a first opening OPa exposing the first contact region CT1 of the recessed region E of the first conductivity-type semiconductor layer 115.

The insulating layer 130 may have a reflective structure to redirect light toward the substrate 105, by reflecting light, having been directed in a direction opposite to the substrate 105, of light emitted by the active layer 120.

The insulating layer 130 may include a multilayer structure. The multilayer structure may have a structure in which a first layer and a second layer having first and second refractive indexes different from each other are alternately stacked. For example, the insulating layer 130 may form a distributed Bragg reflector (DBR). The insulating layer 130 may be basically formed of a material having insulating properties and light transmitting properties, and may be formed using an inorganic or organic material. The insulating layer 130 may be formed to include silicon oxide or silicon nitride having insulating properties and light transmitting properties, and for example, may be formed of $SiO_2$, SiN, $SiO_xN_y$, $TiO_2$, $Si_3N_4$, $Al_2O_3$, TiN, AlN, $ZrO_2$, TiAlN, TiSiN, or the like.

The reflective electrode layer 144 may be disposed on the insulating layer 130, to fill the through-hole PD. Thus, the reflective electrode layer 144 may penetrate through the insulating layer 130 to be connected to the transparent electrode layer 140. The reflective electrode layer 144 may be formed as a single layer or a multilayer structure of a conductive material having ohmic characteristics with the transparent electrode layer 140. The reflective electrode layer 144 may be formed of a material including one or more of materials such as gold (Au), tungsten (W), platinum (Pt), silicon (Si), iridium (Ir), silver (Ag), aluminum (Al), copper (Cu), nickel (Ni), titanium (Ti), chromium (Cr) and the like, with relatively high reflectance, and alloys thereof. Thus, a current applied to the reflective electrode layer 144 may be diffused through the transparent electrode layer 140.

A passivation layer 150 may be disposed on the reflective electrode layer 144, to further enhance external light extraction efficiency. The passivation layer 150 may be formed of the substantially same material as the insulating layer 130, and may form a distributed Bragg reflector according to an example embodiment, similarly to the case of the insulating layer 130. The passivation layer 150 may reflect a portion of light having passed through the transparent electrode layer 140, to the substrate 105, to further improve external light extraction efficiency.

The passivation layer 150 may be disposed on the reflective electrode layer 144 and the insulating layer 130. The passivation layer 150 may include a first opening OPa exposing the first contact region CT1 of the first conductivity-type semiconductor layer 115, and a second opening OPb exposing a third contact region CT3 of the reflective electrode layer 144.

A first conductive pattern 155n and a second conductive pattern 155p may be disposed on the passivation layer 150, and may be formed of the substantially same material and spaced apart from each other. For example, the first conductive pattern 155n and the second conductive pattern 155p may be formed of a material including one or more of a material such as Au, W, Pt, Si, Ir, Ag, Al, Cu, Ni, Ti, Cr or the like and alloys thereof.

The first conductive pattern 155n may be disposed on the passivation layer 150, and may extend onto the first contact region CT1 of the first conductivity-type semiconductor layer 115, to be electrically connected to the first conductivity-type semiconductor layer 115. The first conductive pattern 155n may contact the first contact region CT1 of the first conductivity-type semiconductor layer 115.

The second conductive pattern 155p may be disposed on the passivation layer 150, and may extend onto the third contact region CT3 of the reflective electrode layer 144 to be electrically connected to the reflective electrode layer 144. Thus, the second conductive pattern 155p may be electrically connected to the second conductivity-type semiconductor layer 125 through the reflective electrode layer 144.

When viewed from above, the first conductive pattern 155n may be adjacent to the first edge S1, the second edge S2 and the fourth edge S4, and the second conductive pattern 155p may be adjacent to the third edge S3.

A multilayer insulating structure 160 may be disposed on the first and second conductive patterns 155n and 155p, such that light incident from the outside of the semiconductor light emitting device 10 may be reflected. The multilayer insulating structure 160 may reflect light incident from the outside of the semiconductor light emitting device 10, to prevent light from being absorbed into the semiconductor light emitting device 10, to serve as a passivation layer. In addition, the multilayer insulating structure 160 may be provided with third and fourth openings 160a and 160b for formation of first and second electrode pads 165n and 165p to which first and second solder bumps 170n and 170p are attached. The multilayer insulating structure 160 may have a structure in which a first layer and a second layer having first and second refractive indexes different from each other, are alternately stacked. For example, the multilayer insulating structure 160 may form a distributed Bragg reflector as described above. The multilayer insulating structure 160 may basically be formed of a material having insulating properties and light transmitting properties, and may be formed using an inorganic material or an organic material. The insulating layer 130 may be formed to include silicon oxide or silicon nitride having insulating properties and light transmitting properties, for example, may be formed of $SiO_2$, $SiN$, $SiO_xN_y$, $TiO_2$, $Si_3N_4$, $Al_2O_3$, $TiN$, $AlN$, $ZrO_2$, $TiAlN$, $TiSiN$ or the like.

The multilayer insulating structure 160 will be described in detail with reference to FIGS. 3 and 4.

Referring to FIG. 4, in the multilayer insulating structure 160, a first layer 161 having a first refractive index n1 may be disposed on the first conductive pattern 155n. In addition, a second layer 162, having a second refractive index n2 different from the first refractive index n1, may be disposed on the first layer 161, and the first and second layers 161 and 162 may be alternately stacked at least once or more. A side surface of the multilayer insulating structure 160 may have a surface coplanar with a side surface of the substrate 105.

In the case of the first layer 161 and the second layer 162 of the multilayer insulating structure 160, when a wavelength of light emitted by the active layer 120 of the light emitting structure 110 is referred to λ, the first layer 161 may have a thickness T1 of λ/4n1, and the second layer 162 may have a thickness T2 of λ/4n2. Refractive indexes and thicknesses of the first layer 161 and the second layer 162 of the multilayer insulating structure 160 may be selectively designed, such that the multilayer insulating structure 160 may have a relatively high reflectivity of, for example, 95% or more, with respect to a wavelength of light generated in the active layer 120. According to an example embodiment, the thickness T1 of the first layer 161 and the thickness T2 of the second layer 162 may be substantially the same as each other. An uppermost layer 163 of the multilayer insulating structure 160 may be a second layer, and may have a thickness T3 greater than the thicknesses T1 and T2 of the first and second layers 161 and 162. According to an example embodiment, the uppermost layer 163 may have a thickness twice or more than the thickness T2 of the second layer 162 that is not the uppermost layer, in detail, may have a thickness T3 of λ/2n2 or more. In addition, the multilayer insulating structure 160 may have a thickness T4 of at least 500 nm or more. If the thickness T4 of the multilayer insulating structure 160 is less than 500 nm, stress applied to the first and second conductive patterns 155n and 155p and the passivation layer 150 may increase, and a defect of the semiconductor light emitting device 10 may increase.

The first refractive index n1 may be determined within a range of $0<n1 \leq 2$, and the second refractive index n2 may be determined within a range of $1.8 \leq n2 \leq 4$. In addition, the first and second refractive indexes n1 and n2 may have values within the above ranges, and the second refractive index n2 may have a value greater than that of the first refractive index n1. The second refractive index n2 may have a value greater than a value of a third refractive index n3, a refractive index of an external material OM in contact with the uppermost layer 163 of the multilayer insulating structure 160. Further, the first refractive index n1 may have a value less than a value of the third refractive index n3.

The multilayer insulating structure 160 having such a structure may reflect light L1 incident from the external material OM contacting the uppermost layer 163, to prevent light from being absorbed by the first conductive pattern 155n. Since in general, the light L1 incident from the external material OM is light, having been emitted by the active layer 120 and then reflected by a package body, the light may be reflected to be prevented from being absorbed by the first conductive pattern 155n, thereby improving external light extraction efficiency. It was measured that the external light extraction efficiency of 0.3% or more was improved when the multilayer insulating structure 160 was provided. It may be considered to deposit a metal layer having a high reflectivity, instead of a multilayer insulating structure, in order to only increase the reflectivity, but if a metal layer is deposited, a metal element of the first conductive pattern 155n therebelow may be migrated to the metal layer, thereby causing a problem in which reliability of the semiconductor light emitting device may be reduced as compared with that in the example embodiment.

Table 1 below is a chart comparing the reflectivity of the embodiments of the present inventive concept when the refractive index of the multilayer insulating structure is variously modified, and the reflectivity of the comparative examples without the multilayer insulating structure. In Embodiments 1 and 2, the first layer 161 was formed of $SiO_2$ and the second layer 162 was formed of $TiO_2$, such that a refractive index of the second layer 162 is higher than that of the first layer 161. It can be appreciated that each average reflectance of Embodiments 1 and 2 is much higher than each average reflectance of Comparative Example 1, in which an insulating layer is not provided, Comparative Example 2, in which a refractive index of a first layer is higher than a refractive index of a second layer, and Comparative Example 3, in which only the first layer is provided.

TABLE 1

| Average Reflectance (%) | | | | |
|---|---|---|---|---|
| Embodiment 1 | Embodiment 2 | Comparative Example 1 | Comparative Example 2 | Comparative Example 3 |
| External Material-Air First layer-$SiO_2$ Second layer-$TiO_2$ | External Material-Silicone Resin First Insulating Lay-$SiO_2$ Second layer-$TiO_2$ | External Material-Air First layer-None Second layer-None | External Material-Air First layer-$TiO_2$ Second layer-$SiO_2$ | External Material-Silicone Resin First layer-$TiO_2$ Second layer-None |
| 90.3 | 88.6 | 84.7 | 84.6 | 86.5 |

Figure 5:
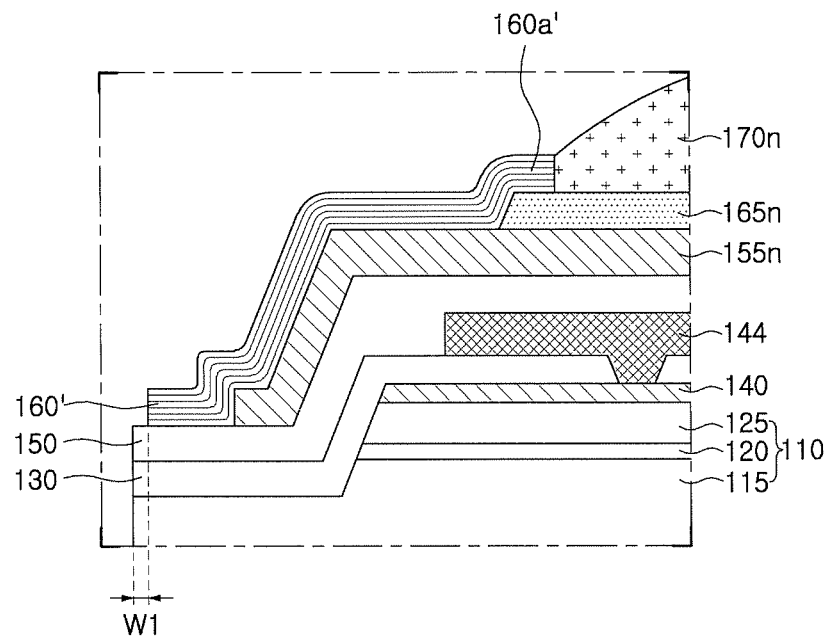
FIGS. 5 and 6 are modified examples of the example embodiment of the present inventive concept.

FIG. 5 is a modified example of the example embodiment of FIGS. 3 and 4, which has a difference, in that a portion 160a' of a multilayer insulating structure 160' is formed on a first electrode pad 165n, and a passivation layer 150 is exposed by a predetermined interval W1 at an edge region thereof. The description of components to which the same reference numerals as those of the foregoing embodiment are assigned will be omitted. Further, although the first electrode pad 165n has been described as a reference, the description thereof may also be similarly applied to the second electrode pad 165p.

A laser beam is irradiated onto a scribing line, a reference line for the cutting of the semiconductor light emitting device 10 into individual elements, while, for example, when the multilayer insulating structure 160' having high reflectance is disposed on the scribing line, it may be difficult to separate the semiconductor light emitting device into individual elements by reflecting the laser beam. Thus, in an example embodiment of the present inventive concept, a region from which the multilayer insulating structure 160' is removed at a predetermined interval W1 may be formed in the scribing line, such that the laser beam irradiated in a process of separating the semiconductor light emitting device 10 into individual elements may be prevented from being reflected.

In addition, the portion 160a' of the multilayer insulating structure 160' may be disposed on the first electrode pad 165n to be overlapped therewith, such that first conductive pattern 155n is not exposed between the multilayer insulating structure 160' and the first electrode pad 165n.

Figure 6:
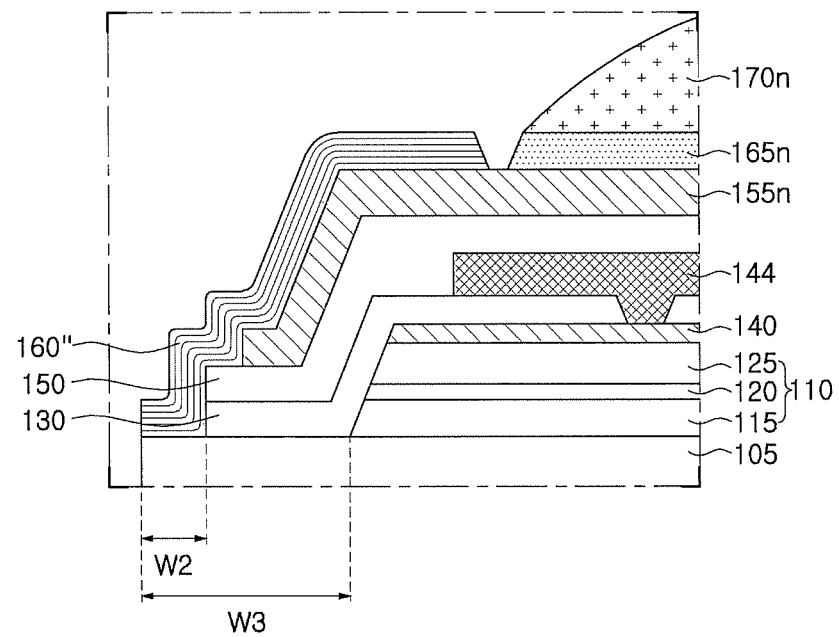

FIG. 6 illustrates another modified example of the example embodiment, which has a difference in that an edge of a multilayer insulating structure 160'' is disposed to be in contact with a substrate 105 in a region corresponding to a predetermined interval W2, and the substrate 105 has a portion W3 from which a light emitting structure 110 is completely removed. In this case, light may be fundamentally prevented from entering through a side of an insulating layer 130 and a side of a passivation layer 150.

FIG. 6 has a difference, in that the multilayer insulating structure 160'' is formed not to contact with the first electrode pad 165n, and the passivation layer 150 is exposed by a predetermined interval W2 at an edge region thereof. The description of components to which the same reference numerals as those of the foregoing embodiment are assigned will be omitted. Also, although the first electrode pad 165n has been described as a reference, the description thereof may be similarly applied to the second electrode pad 165p.

Next, an example of a method of manufacturing a semiconductor light emitting device 10 according to an example embodiment will be described with reference to FIGS. 7 to 20. FIGS. 7, 9, 11, 13, 15, 17 and 19 are schematic plan views illustrating a method of manufacturing the semiconductor light emitting device 10 according to an example embodiment, and FIGS. 8, 10, 12, 14, 16, 18 and 20 are schematic cross-sectional views of regions, taken along lines I-I' in FIGS. 7, 9, 11, 13, 15, 17 and 19, respectively.

Figure 7:
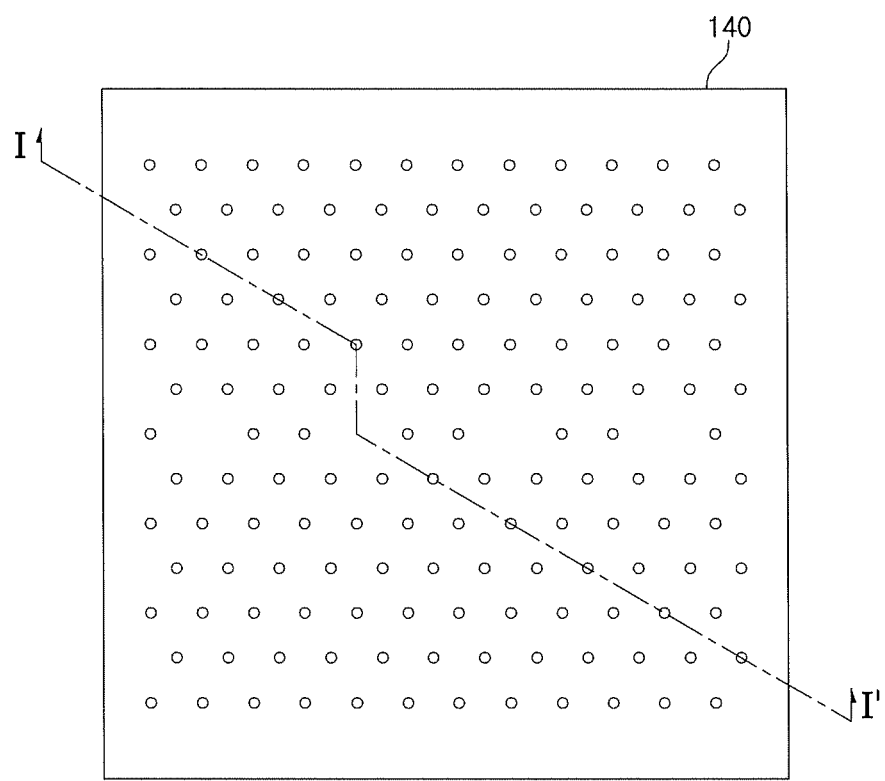
FIGS. 7 to 20 are views illustrating principal processes of manufacturing the semiconductor light emitting device of FIG. 2.
Figure 8:
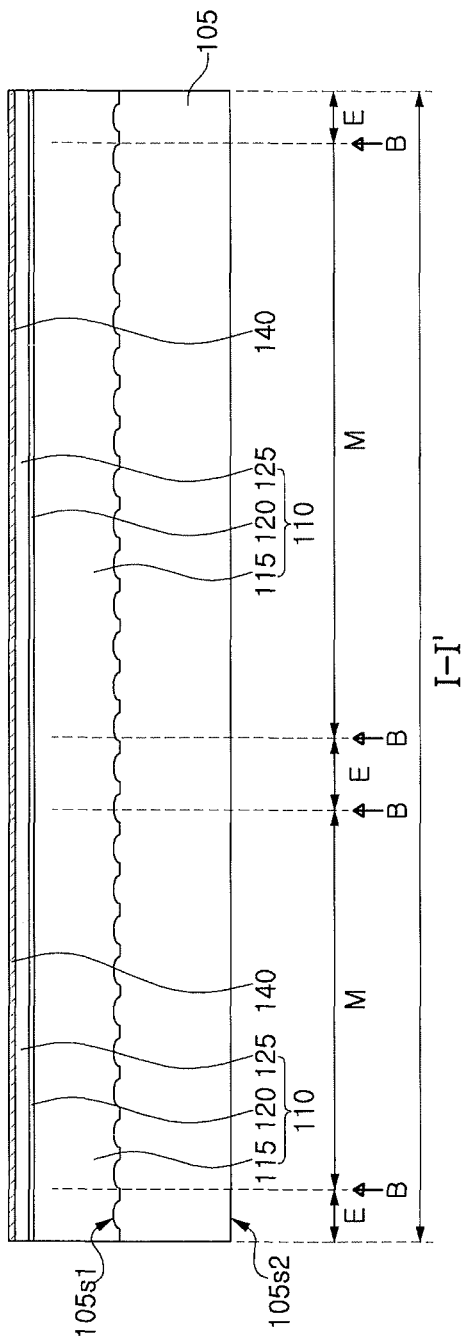

Referring to FIGS. 7 and 8, a light emitting structure 110 may be formed on a substrate 105. The substrate 105 may be formed of a material such as sapphire, Si, SiC, $MgAl_2O_4$, MgO, $LiAlO_2$, $LiGaO_2$, GaN or the like. The substrate 105 may have a front surface 105s1 and a rear surface 105s2 opposing the front surface 105s1.

In an example, a concavo-convex structure may be formed on the front surface 105s1 of the substrate 105. According to an example embodiment, forming the concavo-convex structure on the front surface 105s1 of the substrate 105 may be omitted.

The light emitting structure 110 may be formed on the front surface 105s1 of the substrate 105. The light emitting structure 110 may be formed of a plurality of layers formed using a process such as metal organic chemical vapor deposition (MOCVD), hydride vapor phase epitaxy (HVPE), molecular beam epitaxy (MBE), or the like. For example, the light emitting structure 110 may include a first conductivity-type semiconductor layer 115, an active layer 120, and a second conductivity-type semiconductor layer 125, sequentially formed on the front surface 105s1 of the substrate 105. The first conductivity-type semiconductor layer 115 and the second conductivity-type semiconductor layer 125 may have different conductivity-types. For example, the first conductivity-type semiconductor layer 115 may have n-type conductivity, and the second conductivity-type semiconductor layer 125 may have p-type conductivity.

A transparent electrode layer 140 may be formed on the light emitting structure 110.

Figure 9:
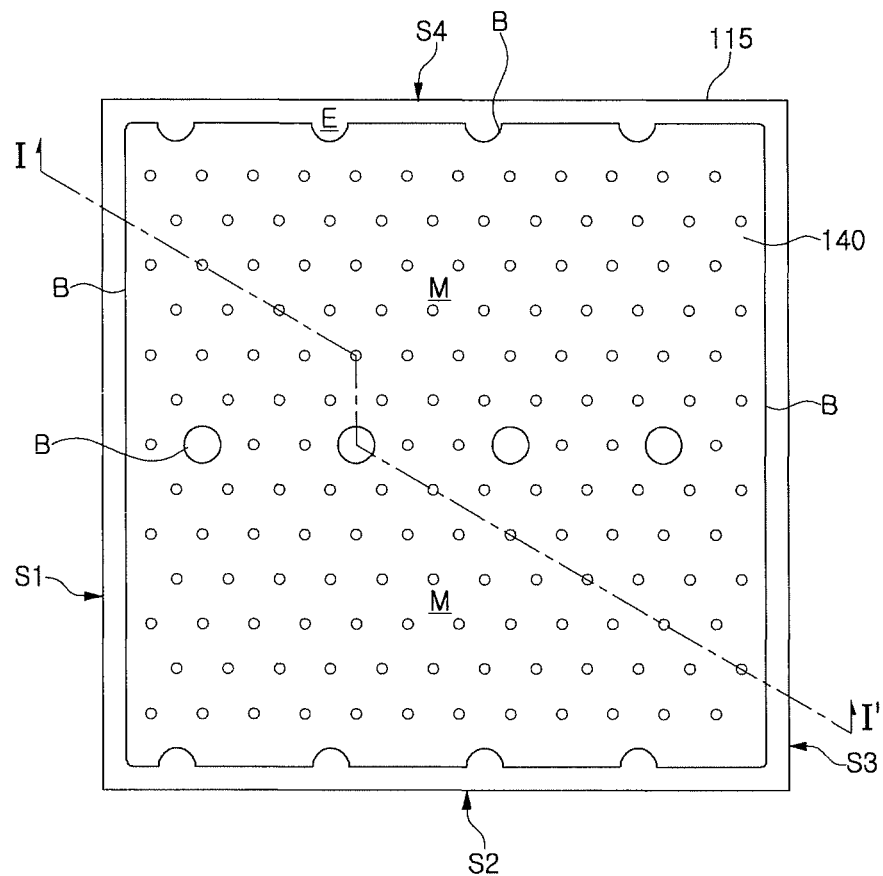
Figure 10:
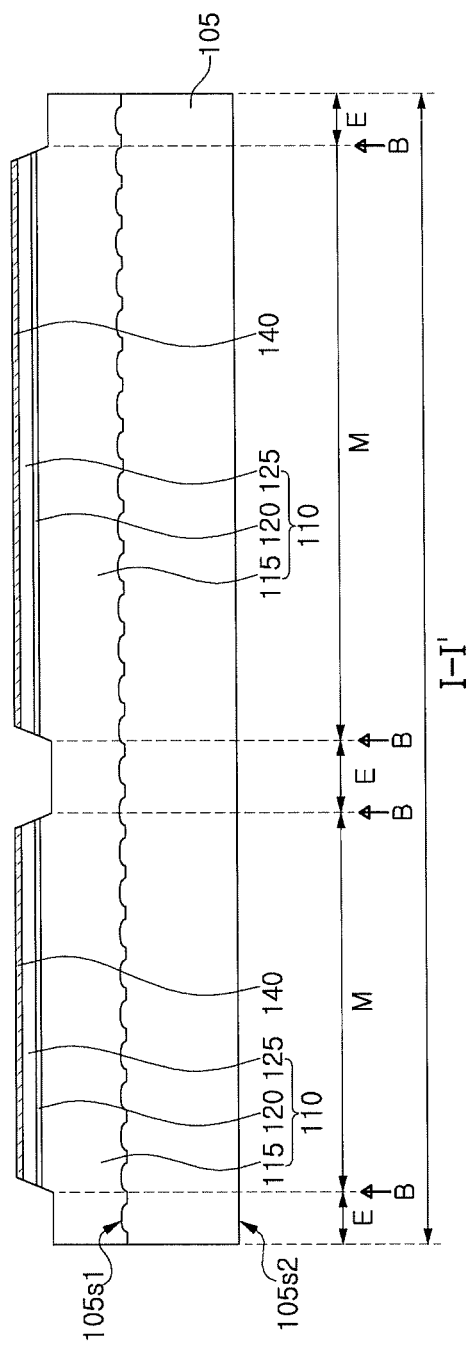

Referring to FIGS. 9 and 10, portions of the transparent electrode layer 140, the second conductivity-type semiconductor layer 125, the active layer 120, and the first conductivity-type semiconductor layer 115 may be etched using a photolithography process. Thus, the light emitting structure 110 may include a recessed region E formed by removing portions of the second conductivity-type semiconductor layer 125, the active layer 120 and the first conductivity-type semiconductor layer 115, and a mesa region M therearound. The mesa region M may be defined as a region in which the second conductivity-type semiconductor layer 125, the active layer 120, and the first conductivity-type semiconductor layer 115 are not etched. The mesa region M may have a relatively protruding shape compared to the recessed region E. The recessed region E may also be referred to as an etching region.

Figure 11:
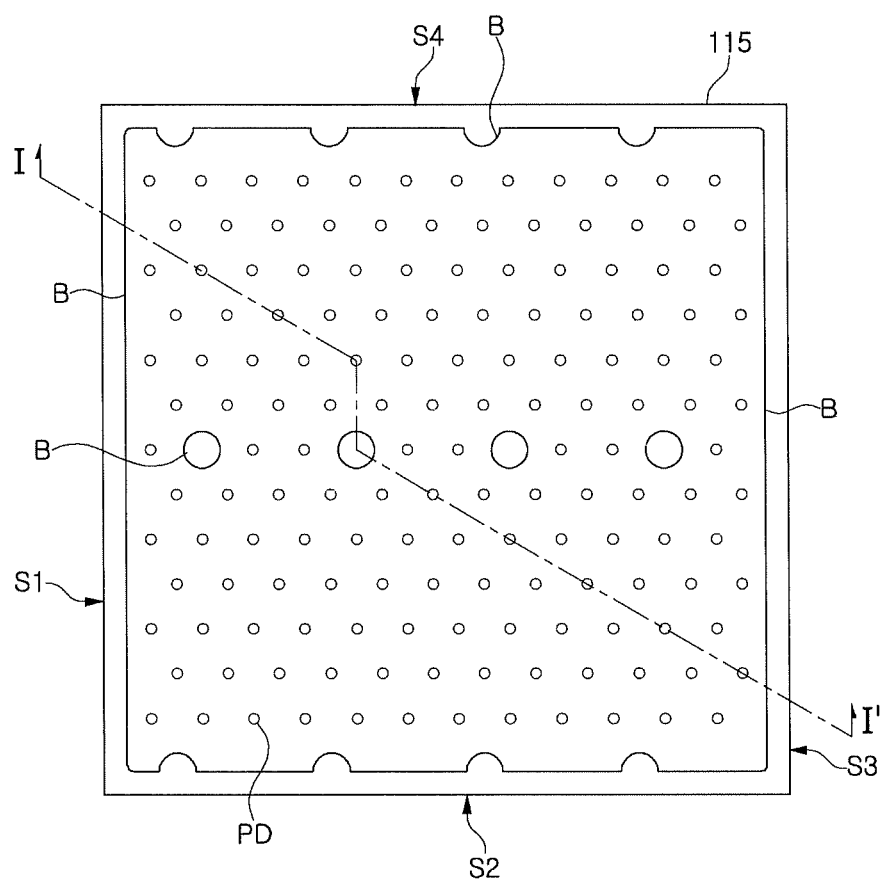
Figure 12:
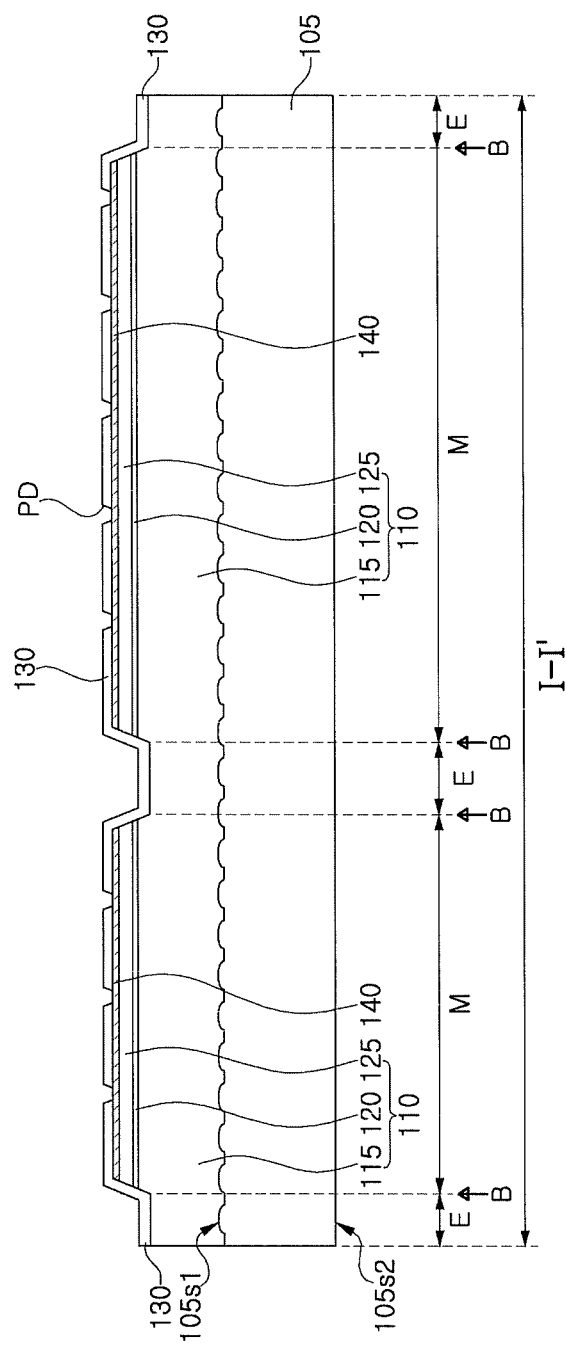

Referring to FIGS. 11 and 12, an insulating layer 130 having a plurality of through holes PD may be formed on the transparent electrode layer 140.

The plurality of through holes PD of the insulating layer 130 may be disposed in a position to expose portions of the transparent electrode layer 140. The plurality of through holes PD may be located in the mesa region M.

Figure 13:
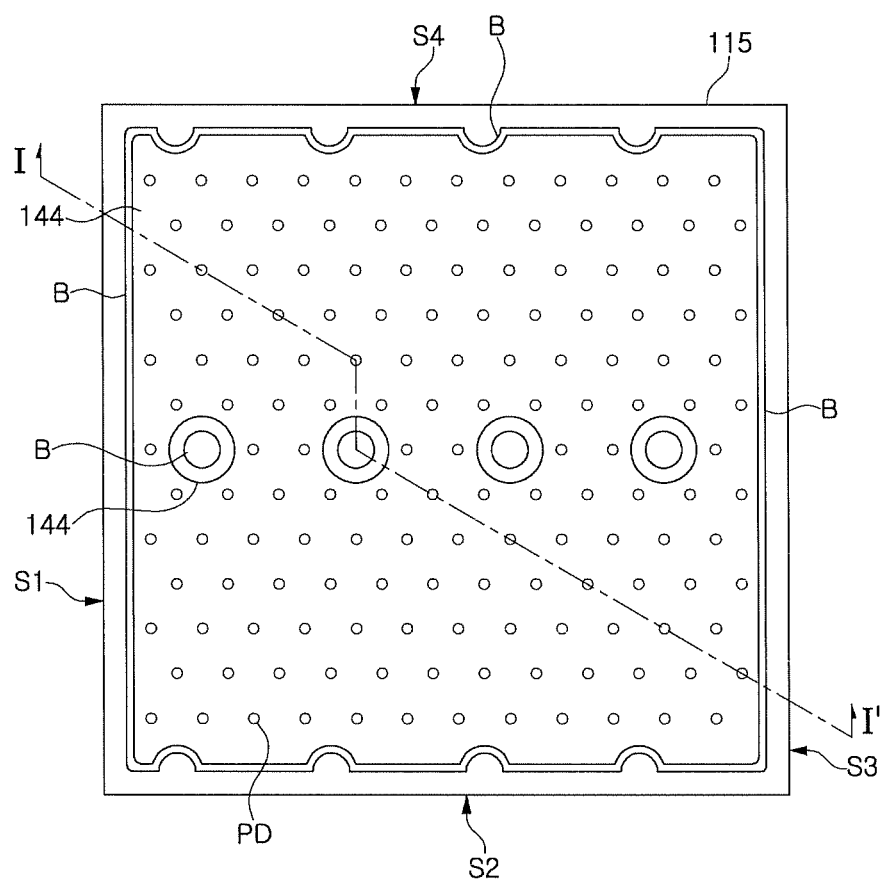
Figure 14:
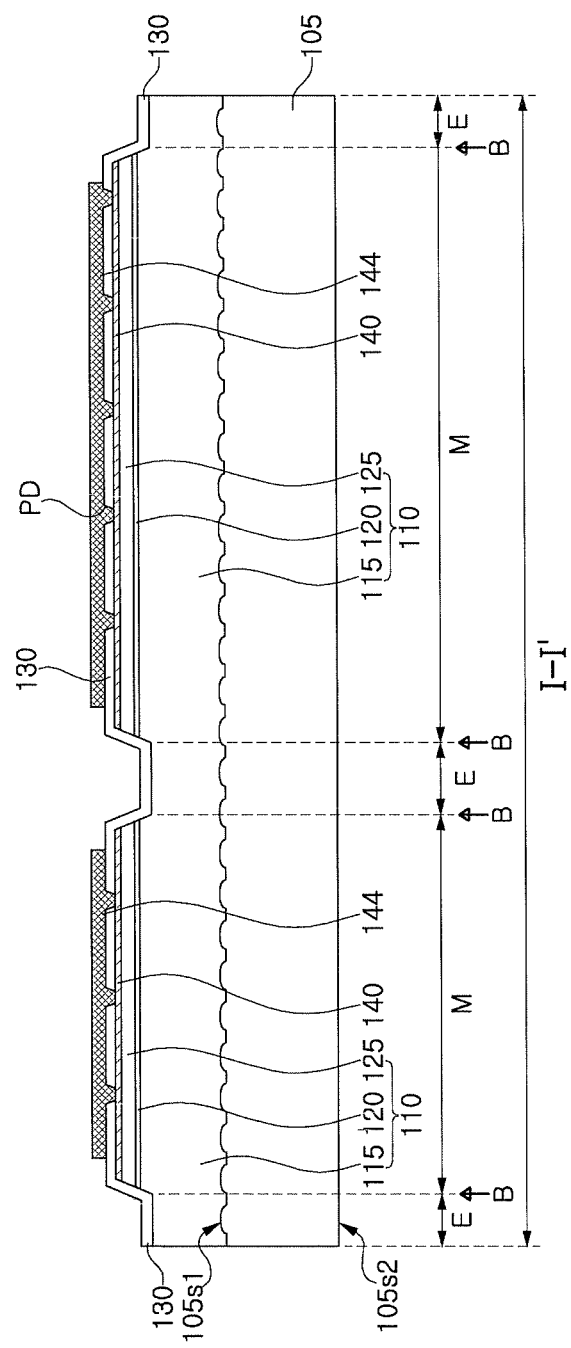

Referring to FIGS. 13 and 14, a reflective electrode layer 144 may be formed on the insulating layer 130. The reflective electrode layer 144 may be formed on the mesa region M, and may be formed on a portion of the insulating layer 130.

Figure 15:
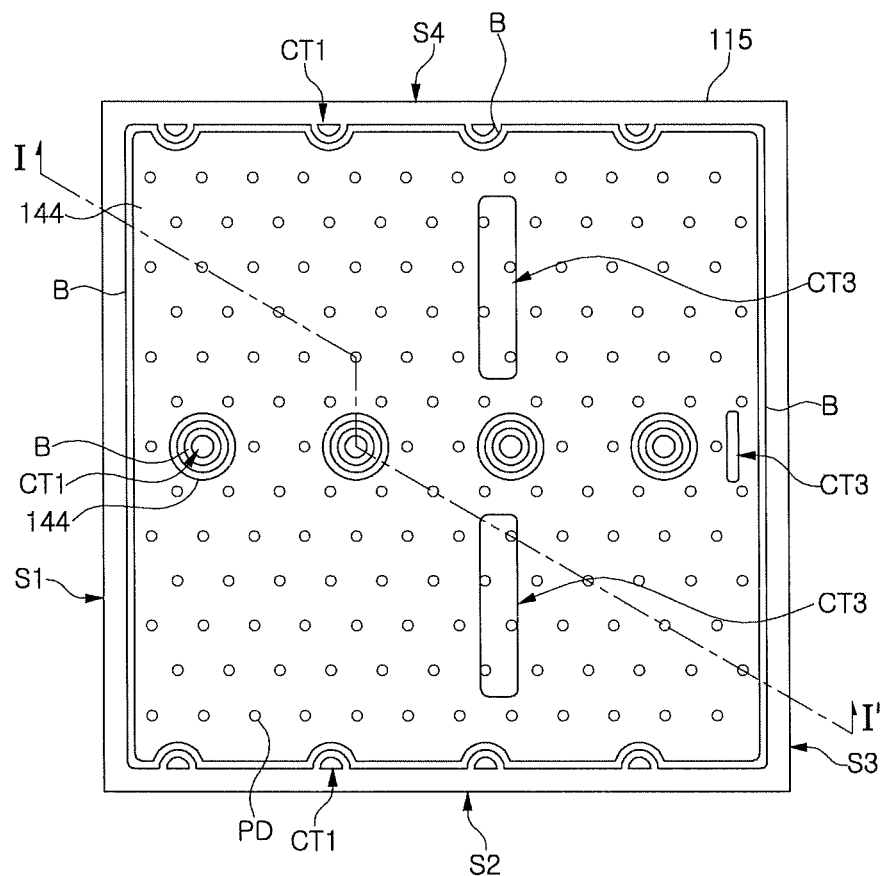
Figure 16:
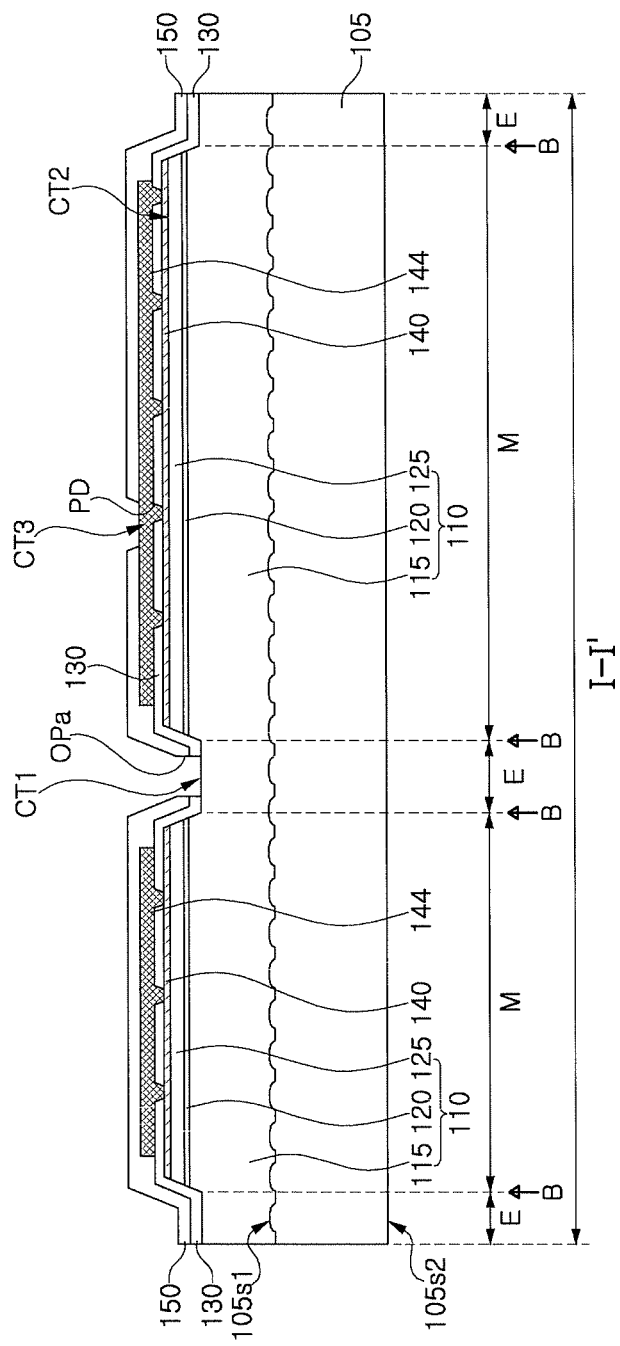

Referring to FIGS. 15 and 16, a passivation layer 150 may be formed on the reflective electrode layer 144. The passivation layer 150 may be disposed to cover the reflective electrode layer 144.

A first opening OPa may be formed to penetrate through the insulating layer 130 and the passivation layer 150 to expose a portion of the first conductivity-type semiconductor layer 115 of the recessed region E, and a second opening OPb may be formed to penetrate through the passivation layer 150 to expose a portion of the reflective electrode layer 144 of the mesa region M.

A surface of the first conductivity-type semiconductor layer 115 exposed by the first opening OPa may be referred to as a first contact region CT1, and a surface of the reflective electrode layer 144 exposed by the second opening OPb may be referred to as a third contact region CT3.

Figure 17:
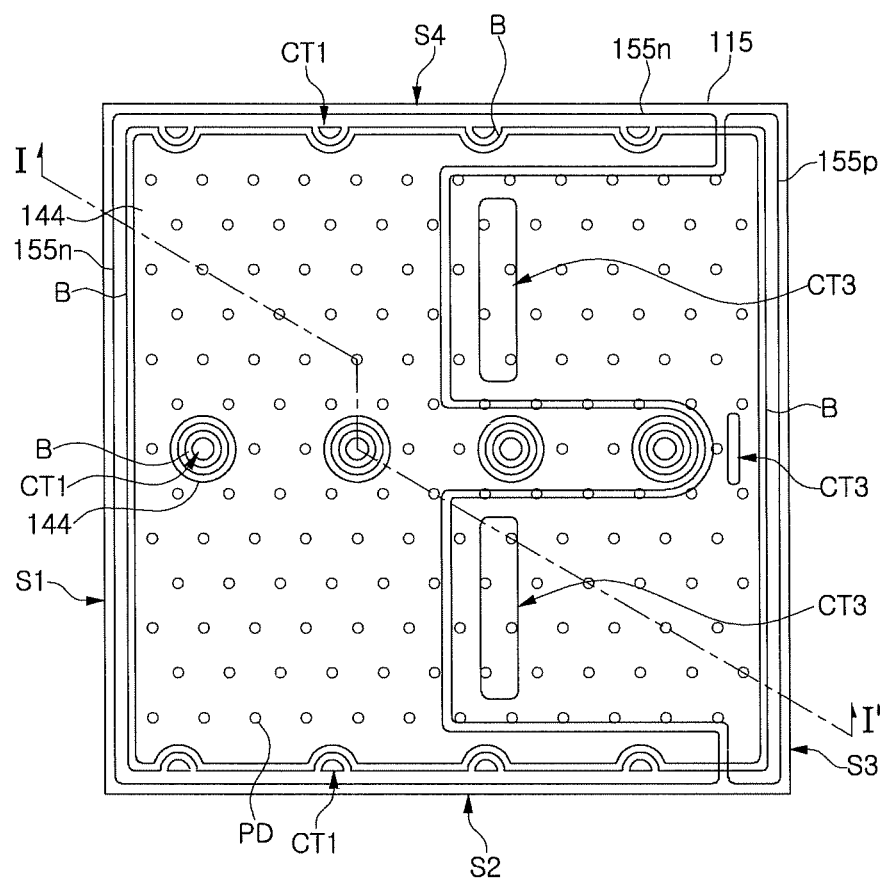
Figure 18:
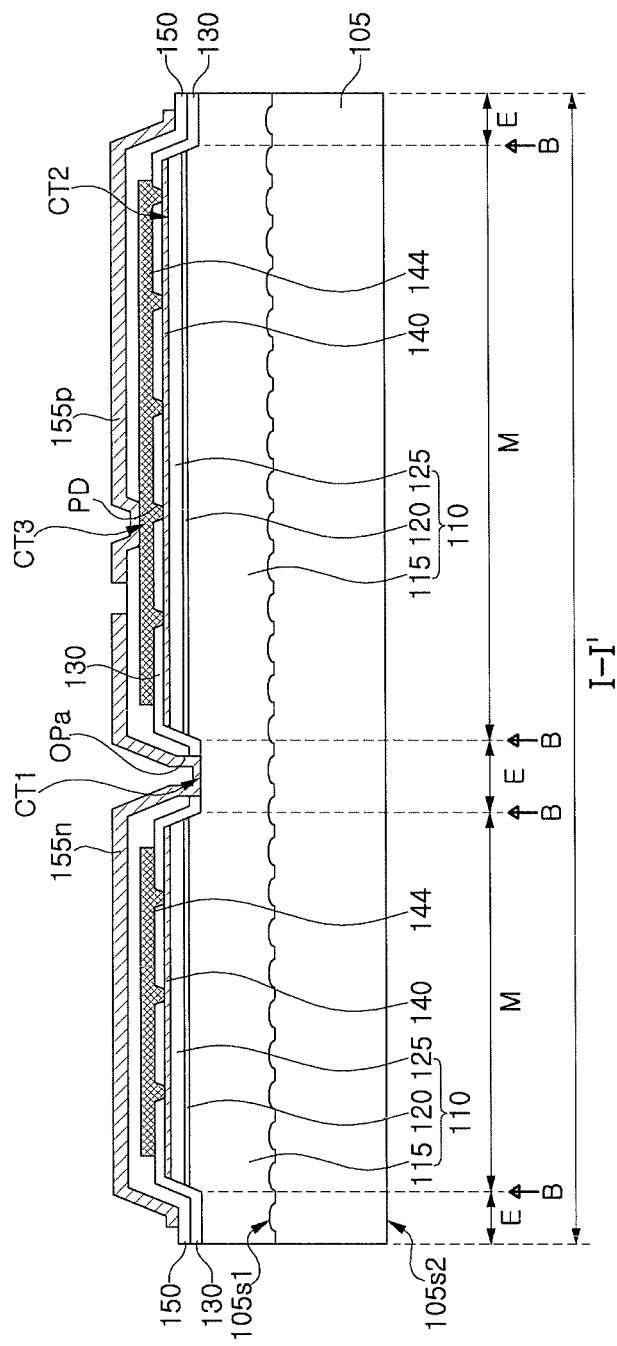

Referring to FIGS. 17 and 18, a first conductive pattern 155n and a second conductive pattern 155p may be formed on the substrate 105 having the passivation layer 150.

Forming the first conductive pattern 155n and the second conductive pattern 155p may include forming a conductive material layer on the substrate 105 having the passivation layer 150, and etching a portion of the conductive material layer using a photolithography process. The first conductive pattern 155n and the second conductive pattern 155p may be formed by the same process, and may thus be formed of the same material. The first conductive pattern 155n and the second conductive pattern 155p may be formed to have substantially the same thickness.

The first conductive pattern 155n may be electrically connected to the first contact region CT1 of the first conductivity-type semiconductor layer 115. The second conductive pattern 155p may be electrically connected to the third contact region CT3 of the reflective electrode layer 144.

Figure 19:
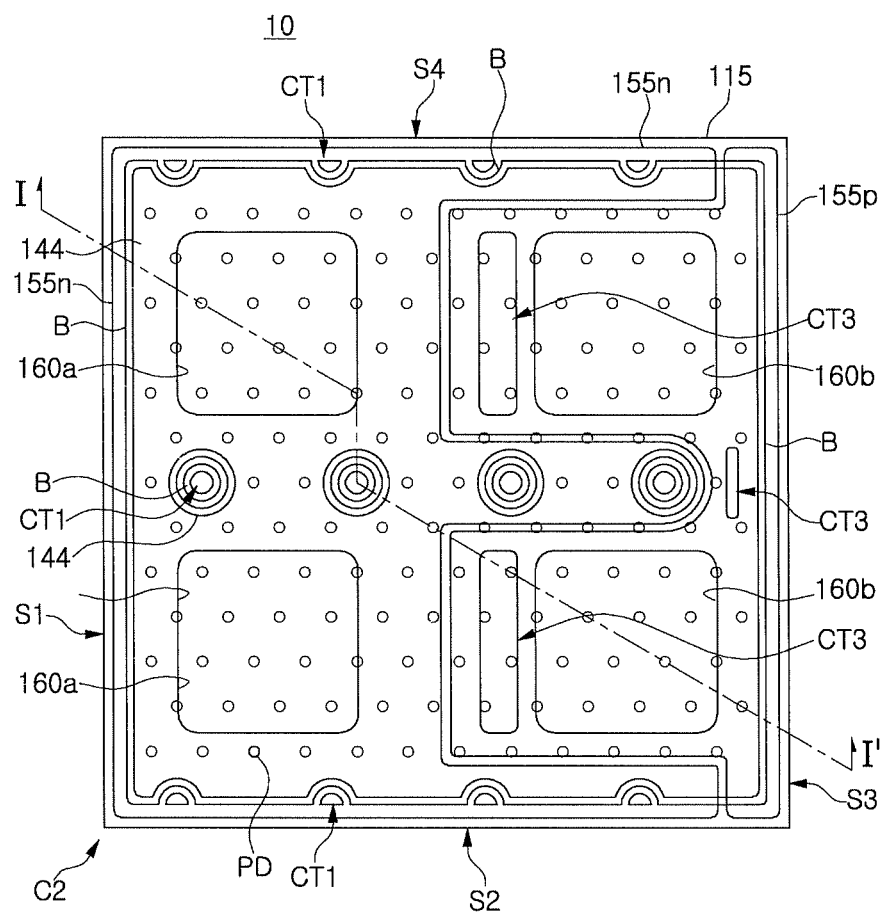
Figure 20:
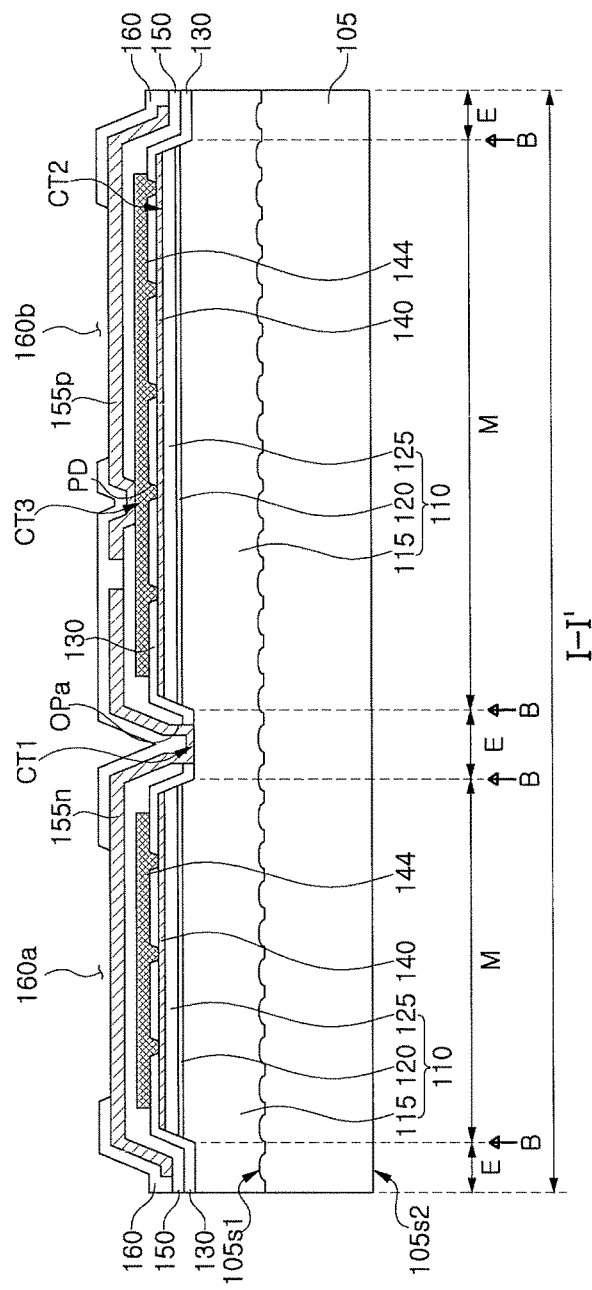

Referring to FIGS. 19 and 20, a multilayer insulating structure 160 having a third opening 160a and a fourth opening 160b may be formed on the substrate 105 including the first conductive pattern 155n and the second conductive pattern 155p.

The third opening 160a of the multilayer insulating structure 160 may expose a portion of the first conductive pattern 155n, and the fourth opening 160b of the multilayer insulating structure 160 may expose a portion of the second conductive pattern 155p.

The portion of the first conductive pattern 155n exposed by the third opening 160a of the multilayer insulating structure 160 may be referred to as a fourth contact region CT4, and the portion of the second conductive pattern 155p exposed by the fourth opening 160b of the multilayer insulating structure 160 may be referred to as a fifth contact region CT5.

Although the example embodiment illustrates that, after the multilayer insulating structure 160 is formed, first and second electrode pads 165n and 165p are formed in a subsequent process, by way of example, the multilayer insulating structure 160 may also be formed after the first and second electrode pads 165n and 165p are formed, according to an example embodiment.

Referring again to FIGS. 1 and 2, the first and second electrode pads 165n and 165p may be formed on the substrate 105 including the multilayer insulating structure 160. The first electrode pad 165n may be formed on the fourth contact region CT4 of the first conductive pattern 155n, and the second electrode pad 165p may be formed on the fifth contact region CT5 of the second conductive pattern 155p. The first and second electrode pads 165n and 165p may be an under bump metallurgy (UBM). In an example, the number and arrangement of the first and second electrode pads 165n and 165p may be variously modified.

First and second solder bumps 170n and 170p may be formed on the substrate 105 including the first and second electrode pads 165n and 165p. The first solder bump 170n may be formed on the first electrode pad 165n, and the second solder bump 170p may be formed on the second electrode pad 165p.

Figure 21:
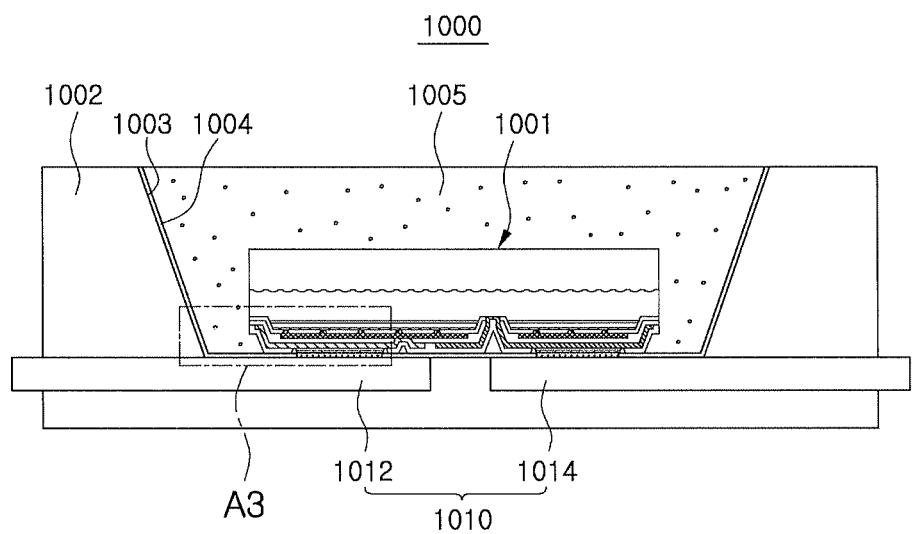
FIG. 21 is a cross-sectional view illustrating an example in which a semiconductor light emitting device according to an example embodiment of the present inventive concept is applied to a semiconductor light emitting device package.

The semiconductor light emitting device 10 as described above may be commercialized as a package. Hereinafter, an example in which the semiconductor light emitting device 10 as described above is applied to a package will be described with reference to FIGS. 21 and 22. FIG. 21 is a cross-sectional view schematically illustrating an example in which a semiconductor light emitting device according to an example embodiment is applied to a semiconductor light emitting device package.

Referring to FIG. 21, a semiconductor light emitting device package 1000 may include a semiconductor light emitting device 1001 as a light source, a package body 1002, a pair of lead frames 1010, and an encapsulation portion 1005. In this case, the semiconductor light emitting device 1001 may be the semiconductor light emitting device 10 of FIG. 1, which has been described above, and thus, a detailed description thereof will be omitted.

The semiconductor light emitting device 1001 may be mounted on the pair of lead frames 1010. The pair of lead frames 1010 may include a first lead frame 1012 and a second lead frame 1014. The semiconductor light emitting device 1001 may be connected to the first lead frame 1012 and the second lead frame 1014 through the first solder bump 170n and the second solder bump 170p (see FIG. 2), respectively.

The package body 1002 may include a trench 1003 in which the semiconductor light emitting device 1001 is disposed, and a first multilayer insulating structure 1004 may be disposed on an internal wall of the trench 1003, to improve reflective efficiency and light extraction efficiency. The first multilayer insulating structure 1004 may have a region in which the first and second lead frames 1012 and 1014 are exposed, in a region corresponding to a bottom surface of the trench 1003. The first multilayer insulating structure 1004 may also be formed in a region in which the semiconductor light emitting device 1001 is mounted, except for a region in which the first solder bump 170*n* and the second solder bump 170*p* are to be bonded thereto. Thus, light incident on a lower portion of the semiconductor light emitting device 1001 may also be reflected.

Figure 22:
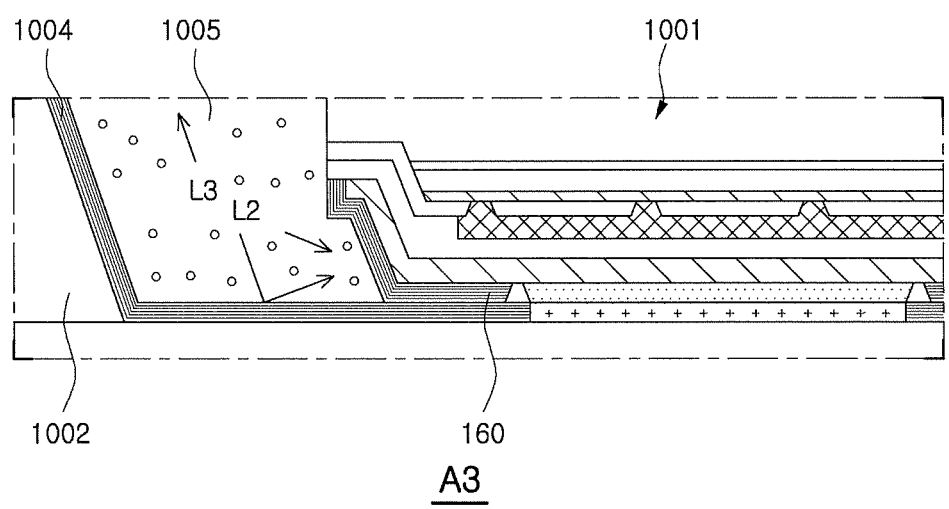
FIG. 22 is an enlarged view of portion A3 in FIG. 21.

Referring to FIG. 22, the first multilayer insulating structure 1004 may have substantially the same stacking structure as that of a second multilayer insulating structure 160 disposed in the semiconductor light emitting device 1001. The second multilayer insulating structure 160 may have substantially the same stacking structure as that of the multilayer insulating structure 160 described above with reference to FIG. 4. Thus, in the case of the first multilayer insulating structure 1004, a first layer having a first refractive index n1 may be disposed to be in contact with the trench 1003, and a second layer having a second refractive index n2 higher than the first refractive index n1 may be disposed on the first layer, similarly to the stacking structure of the multilayer insulating structure 160 illustrated in FIG. 4. The first layer and the second layer may be alternately stacked. When the wavelength of light emitted by an active layer of the semiconductor light emitting device 1001 is referred to $\lambda$, the first layer may have a thickness of $\lambda/4n1$, and the second layer may have a thickness of $\lambda/4n2$. An uppermost layer of the first multilayer insulating structure 1004, contacting the encapsulation portion 1005, may have a thickness of $\lambda/2n2$, greater than a thickness of the first and second layers that are not the uppermost layer.

As such, since the first multilayer insulating structure 1004 and the second multilayer insulating structure 160 have substantially the same stacking structure, by again reflecting light L2, having been reflected back to the semiconductor light emitting device 1001 by total internal reflection, of light emitted by the semiconductor light emitting device 1001, a light path L3 directed to an upper portion of the package body 1002 may be provided, thereby using the first multilayer insulating structure 1004 and the second multilayer insulating structure 160 as light guides.

In the trench 1003, the encapsulation portion 1005 formed of a light transmissive material may be formed to encapsulate the semiconductor light emitting device 1001. The encapsulation portion 1005 may include a wave converting material. In detail, the encapsulation portion 1005 may be formed by including, at least one or more types of phosphor excited by light emitted by the semiconductor light emitting device 1001 to emit different wavelengths of light, in a light transmissive resin such as an epoxy resin, a silicone resin or the like. Thus, blue light, green light, red light, white light, ultraviolet light, and the like may be emitted.

As set forth above, with a semiconductor light emitting device and a semiconductor light emitting device package according to an example embodiment, surface reflectivity of a semiconductor light emitting device may be improved to prevent light having been reflected from the surface of a semiconductor light emitting device package from being again incident onto the semiconductor light emitting device, and light extraction efficiency may be improved.

While example embodiments have been shown and described above, it will be apparent to those skilled in the art that modifications and variations could be made without departing from the scope of the present inventive concept as defined by the appended claims.

What is claimed is:

1. A semiconductor light emitting device package comprising:
    a package body comprising a trench in which a first multilayer insulating structure is disposed on an internal surface of the trench;
    a semiconductor light emitting device electrically connected by flip chip bonding in the trench; and
    an encapsulation portion filling an interior of the trench to cover the semiconductor light emitting device,
    wherein the semiconductor light emitting device comprises:
    a first conductivity-type semiconductor layer comprising a recessed region and a protruding region;
    an active layer and a second conductivity-type semiconductor layer sequentially stacked on the protruding region of the first conductivity-type semiconductor layer;
    a reflective electrode layer disposed on the second conductivity-type semiconductor layer;
    an insulating layer covering the first conductivity-type semiconductor layer and the reflective electrode layer, wherein the insulating layer comprises a first opening disposed on a contact region of the first conductivity-type semiconductor layer and a second opening disposed on a contact region of the reflective electrode layer;
    a first conductive pattern disposed on the insulating layer, wherein the first conductive pattern extends into the first opening of the insulating layer to be electrically connected to the contact region of the first conductivity-type semiconductor layer;
    a second conductive pattern disposed on the insulating layer, wherein the second conductive pattern extends into the second opening of the insulating layer to be electrically connected to the reflective electrode layer; and
    a second multilayer insulating structure covering the first and second conductive patterns, wherein the second multilayer insulating structure comprises third and fourth openings disposed on the first and second conductive patterns,
    wherein the first multilayer insulating structure comprises a distributed Bragg reflector in which a first layer having a first refractive index and a second layer having a second refractive index higher than the first refractive index are alternately stacked, and the second multilayer insulating structure comprises a distributed Bragg reflector in which a third layer having the first refractive index and a fourth layer having the second refractive index are alternately stacked, and
    wherein the first and second multilayer insulating structures have substantially a same total thickness.

2. The semiconductor light emitting device package of claim 1, wherein the second multilayer insulating structure has a first surface in contact with the first and second conductive patterns, and a second surface facing the first surface; and
    the first surface is provided with the third layer disposed thereon, and the second surface is provided with the fourth layer disposed thereon.

3. The semiconductor light emitting device package of claim 2, wherein the first multilayer insulating structure has a third surface in contact with the package body, and a fourth surface facing the third surface; and
    the third surface is provided with the first layer disposed thereon, and the fourth surface is provided with the second layer disposed thereon.

4. The semiconductor light emitting device package of claim 3, wherein the second layer disposed on the fourth surface has a thickness of $\lambda/2n2$, where $\lambda$ is a wavelength of light emitted by the active layer, and n2 is the second refractive index.

5. The semiconductor light emitting device package of claim 2, wherein the fourth layer disposed on the second surface has a thickness of $\lambda 2n2$, where $\lambda$ is a wavelength of light emitted by the active layer, and n2 is the second refractive index.

6. The semiconductor light emitting device package of claim 1, wherein the encapsulation portion comprises a light transmissive material, and a refractive index of the light transmissive material is higher than the first refractive index and lower than the second refractive index.

7. The semiconductor light emitting device package of claim 1, wherein the first and second multilayer insulating structures have substantially a same stacking structure.

8. The semiconductor light emitting device package of claim 1, wherein the package body further comprises first and second lead frames exposed on a lower surface-of the trench, and
    the semiconductor light emitting device is electrically connected to the first and second lead frames through the first multilayer insulating structure.

* * * * *